United States Patent [19]

Lee

[11] Patent Number: 5,350,703
[45] Date of Patent: Sep. 27, 1994

[54] METHOD FOR FABRICATION MASK ROM

[75] Inventor: Byoung I. Lee, Chungcheongnam-do, Rep. of Korea

[73] Assignee: Gold Star Electron Co., Ltd., Rep. of Korea

[21] Appl. No.: 110,651

[22] Filed: Aug. 20, 1993

[30] Foreign Application Priority Data

Aug. 20, 1992 [KR] Rep. of Korea ............... 14981/1992

[51] Int. Cl.$^5$ .......................................... H01L 21/265
[52] U.S. Cl. .......................... 437/48; 437/52; 437/192.4
[58] Field of Search ............ 437/48, 49, 240, 924, 437/52; 148/DIG. 114

[56] References Cited

U.S. PATENT DOCUMENTS

| | | | |
|---|---|---|---|
| 4,358,889 | 11/1982 | Dickman et al. | 437/52 |
| 4,365,405 | 12/1982 | Dickman et al. | 437/52 |
| 4,649,629 | 3/1987 | Miller et al. | 437/48 |
| 5,094,971 | 3/1992 | Kanebako | 437/52 |

FOREIGN PATENT DOCUMENTS

| | | | |
|---|---|---|---|
| 0073130 | 3/1983 | European Pat. Off. | 437/48 |
| 60-241259A | 11/1985 | Japan | 437/48 |

*Primary Examiner*—George Fourson
*Assistant Examiner*—Richard A. Booth
*Attorney, Agent, or Firm*—Faegre & Benson

[57] ABSTRACT

A method for fabricating a mask ROM capable of reducing the processing time taken in fabricating the MROM by the manufacturer after the order by the user, thus improving the productivity. For fabricating the mask ROM, first, a fabrication of a MOS transistor is achieved by forming a gate oxide film, a gate electrode and source/drain regions on a semiconductor substrate. After the formation of the MOS transistor, a BPSG film, a metal electrode, a passivation film and a pad are sequentially formed. Finally the implantation of ROM code ions in accordance with the user's order is carried out, completing the fabrication of the MROM. It is possible to reduce the processing time (turn around time) taken in fabricating the MROM by the manufacturer after the order by the user because the ROM code ion implantation is carried out at the final stage of the MROM fabrication.

2 Claims, 4 Drawing Sheets

METHOD FOR FABRICATION MASK ROM

BACKGROUND OF THE INVENTION

1. Field of the Invention

The present invention relates to a method for fabricating a mask read only memory (ROM), and more particularly to a method for fabricating a mask ROM of the ion implantation type.

2. Description of the Prior Art

ROMs are memory devices capable of storing information, without any change, for the operating life thereof. They are a kind of non-volatile memory device in which information stored is not erased even if the supply of electric power were to be shut off.

Such ROMs are widely employed in look-up tables and character generators.

ROMs are mainly classified into mask ROMs (MROMs), in which data desired by the user is written by use of a mask in a fabricating process for the devices, and programmable ROMs (PROMs), in which data is electrically programmed after the fabrication. PROMs are further classified into erasable PROMs (EPROMs), in which data stored is erasable by use of ultraviolet ray so that new data can then be programmed, and electrically erasable ROMs (EEPROMs), in which data stored is electrically erasable so that new data can then be programmed.

MROMs in which data desired by the user is written into the ROM by use of a mask in a fabricating process for the devices have several advantages. A first is the advantage of having a simple circuit construction in which no separate data writing circuit is required. A second is the advantage of requiring only a simple fabrication in which the memory cell structure used requires no specific fabricating process. A third advantage lies in providing various memory cell systems from which an appropriate one can be selected according to the use intended.

However, such MROMs have a disadvantage because the MROMs are fabricated according to an order for codes, the time (turn around time) taken in supplying products from the manufacturer to the final user is lengthy, as compared with other ROMs such as EPROMs and EEPROMs. The MROMs also have the disadvantage of being difficult to produce having multiple codes in small quantities. Moreover, there is the drawback that the manufacturer or the user may be taking more or less of a risk, since it is impossible to change data after the fabrication because the programming of data is achieved during the fabrication.

Data writing methods for MROMs widely used are those of a contact opening and closing method, wherein writing of information is achieved by opening and closing contacts, and an ion implantation method, wherein writing of information is achieved by use of ion implantation. MROMs are mainly classified into NOR type MROMs and NAND type MROMs as defined by the circuit structure of the memory cell which is used in the device.

FIGS. 1A and 1B are pictorial schematic views respectively illustrating a memory cell array in a conventional MROM of the contact opening and closing type. FIG. 1A is a plan view of a layout of the memory cell array, whereas FIG. 1B is a schematic circuit diagram of an equivalent circuit of the memory cell array.

In FIG. 1A, a region 1 surrounded by the dotted line corresponds to one of a plurality of memory cells arranged in a matrix manner in the memory cell array. Each memory cell 1 is realized by either an N type or a P type MOS transistor.

Since writing of data in the MROM of the contact opening and closing type is achieved according to either the presence of a contact hole 5 or the absence thereof, the opening and closing of contact hole 5, namely, the presence or absence of contact holes 5, corresponds to logic levels "1" and "0" of the stored data, respectively.

In the MROM of the contact opening and closing type, a diffusion region 2 which serves as a drain region of the MOS transistor, is connected to a bit line 6 through each corresponding contact hole 5. Thus the process of forming ROM codes becomes nearer to a final step in the fabrication process. As a result, the processing time required to be taken in fabricating the MROM by the manufacturer after the ordering by the consumer, i.e., the "turn around time" (TAT), is reduced.

FIGS. 2A and 2B are schematic and pictorial views respectively illustrating a memory cell array in a conventional MROM of the ion implantation type. FIG. 1A is a plan view of a layout of such a memory cell array, whereas FIG. 1B is a circuit diagram of an equivalent circuit of the memory cell array.

In FIGS. 2A and 2B, elements corresponding to those in FIGS. 1A and 1B are denoted by the same reference numerals.

The MROM shown in FIG. 2A is of the ion implantation type, in which a region 7 surrounded by the dotted line corresponds to an impurity-implanted region formed at a channel region of a MOS transistor.

In this case, the memory cell 1 comprises a plurality of MOS transistors which include those each having impurity-implanted regions 7 and others not having an impurity-implanted region 7. The MOS transistors having the impurity-implanted region 7 become transistors operating in the depletion mode corresponding to the level "1" of information, whereas the MOS transistors having no impurity-implanted region 7 become transistors operating in the enhancement mode corresponding to a logic level "0" of information.

In FIG. 2B, the reference numerals E and D denote MOS transistors of the enhancement and the depletion modes, respectively.

In an MROM of the ion implantation type, the ion implantation is carried out at a point of time nearer to the initial process step than to the final process step. Thus the processing time for fabricating an MROM by the manufacturer after an order by a user, the TAT, is lengthened, as compared to MROMs of the contact opening and closing type.

For fabricating such conventional ion implantation MROMs, first, a gate oxide film, a gate electrode and source/drain regions are formed on a semiconductor substrate, forming a MOS transistor. Thereafter, an ion implantation step for introducing ROM codes is carried out, so that data in accordance with the user's order is programmed.

A boron phosphorous silicate glass (BPSG) film is then deposited over the MOS transistor. This BPSG film is then heat treated to form a smoothing film. Thereafter, the steps for formation of contact holes and metal film are carried out. A passivation layer is then deposited over the entire exposed surface of the resulting structure. Thereafter, formation of contact pads is carried out, to complete the fabrication of the MROM.

In such a conventional method, there is a problem of a low productivity, because the process of implanting ROM code ions is carried out at an initial stage of the fabrication, which results in a very long turn around time, in that the fabrication of MROM is achieved after an order for ROM codes is placed by the user, at which time ROM code ions are implanted by the manufacturer in accordance with the user's order.

SUMMARY OF THE INVENTION

An object of the invention is to provide a method for fabricating a MROM wherein the fabrication of the MROM is accomplished by implanting ROM code ions according to the user's order at a final step after the step of forming pads, which reduces the processing time needed to fabricate the MROM by the manufacturer after an order by a user, thus improving the productivity.

In accordance with the present invention, this object can be accomplished by providing a method for fabricating a mask read only memory, comprising the steps of: forming a gate oxide film, a gate electrode and source and drain regions on one side portion of a semiconductor substrate to form a MOS transistor; depositing a BPSG film over the entire exposed surface of the resultant structure after the formation of the MOS transistor, to smooth the structure; forming a metal electrode on portions of the BPSG film, which portions are disposed over the source and drain regions; forming a pad on a portion of the BPSG film, which portion is disposed over the other side portion of the semiconductor substrate (the pad being adapted to provide a connection with an outer circuit); coating a nitride film over the entire exposed surface of the resultant structure after the formation of the pad and removing a portion of the nitride film disposed over the pad to expose the pad; coating a photoresist film over the entire exposed surface of the resultant structure after the partial removal of the nitride film and removing portions of the photoresist film, which portions are disposed over the gate electrode and portions of the source and drain regions of the MOS transistor to be implanted with ROM code ions, to partially expose the nitride film, the source and drain region portions being disposed adjacent to the gate electrode; removing the exposed portion of the nitride film to partially expose the BPSG film; selectively removing the exposed portion of the BPSG film to expose the gate electrode, the source and drain region portions disposed adjacent to the gate electrode; implanting ROM code ions in the exposed gate electrode, source and drain region portions; forming a PIQ film over the entire exposed surface of the resultant structure after ion implantation and removal of a portion of the PIQ film, which portion is disposed over the remaining photoresist film; removing the remaining photoresist film; and curing the remaining PIQ film by a heat treatment while simultaneously forming an impurity diffusion region in a portion of the semiconductor substrate which is disposed beneath the gate electrode.

BRIEF DESCRIPTION OF THE DRAWINGS

Other objects and aspects of the invention will become apparent from the following description of embodiments with reference to the accompanying drawings in which.

DETAILED DESCRIPTION OF THE INVENTION

The present invention provides a method for fabricating a MROM, which comprises a first process of forming a MOS transistor for realizing a memory cell on a semiconductor substrate and a second process of implanting ROM code ions in the MOS transistor on the semiconductor substrate when an order for an MROM is made by a user.

The first process is that of fabricating a memory cell which includes no written data. The fabrication process comprises the steps of forming the MOS transistor constituted by a gate oxide film, a gate electrode and source/drain regions formed on the semiconductor substrate, and then forming pads on the MOS transistor for connecting the MOS transistor to other circuits. The second process is that of completing the MROM programmed with data. This programming comprises the step of implanting ROM code ions in the previously unprogrammed memory cell according to the user's order, for purposes of writing data in the memory cell.

FIGS. 3A to 3E illustrate an MROM fabricating method in accordance with an embodiment of the present invention.

Figure 3A:
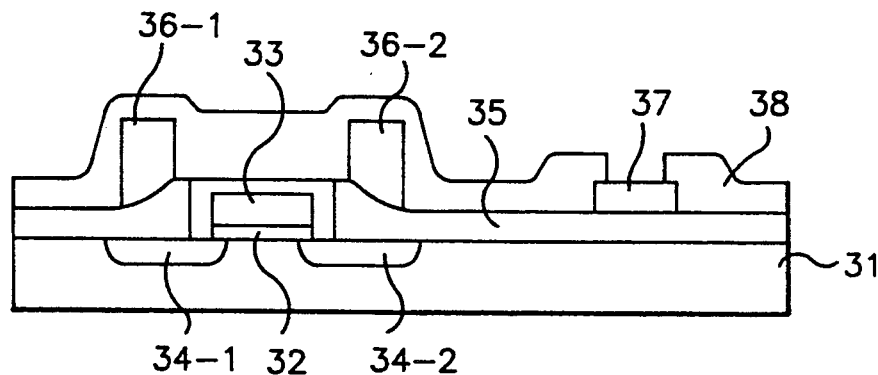
FIGS. 3A to 3E are schematic sectional views illustrating a method for fabricating a MROM of the ion implantation type in accordance with the present invention.

FIG. 3A illustrates the process of fabricating a memory cell which initially has no written data. In accordance with the process, first, on a semiconductor substrate 31 are formed a gate oxide film 32 and a gate electrode 33, as shown in FIG. 3A. Impurity ions are then implanted in the semiconductor substrate 31 so as to form impurity diffusion regions 34-1 and 34-2 for source and drain regions. Thus, a MOS transistor is provided at one side portion of the semiconductor substrate 31.

Thereafter, a BPSG film 35 is coated over the entire exposed surface of the resultant structure to provide smooth film.

Metal electrodes 36-1 and 36-2 are formed at portions of the BPSG film 35 which are disposed over the source and drain regions 34-1 and 34-2, respectively. A pad 37 for connecting an outer circuit to the MROM to be fabricated is also formed at a portion of the BPSG film 35 disposed over the portion of substrate 31 on which the MOS transistor is not disposed.

After the formation of pad 37, a nitride film 38 for stabilization is formed over the entire exposed surface of the resulting structure. Thereafter, the nitride film 38 is partially removed at its portion disposed over the pad 37 so as to expose the pad 37.

Thus fabrication of a memory cell which includes no written data is completed.

FIGS. 3B to 3E illustrate the process of finally fabricating the MROM programmed with data, by implanting ROM code ions in a memory cell which initially has no written data, for writing data in the memory cell according to the user's order.

After the fabrication of the MROM including no written data as shown in FIG. 3A, the programming of the MROM with written data is carried out by implanting ROM code ions corresponding to the user's order.

Figure 3B:
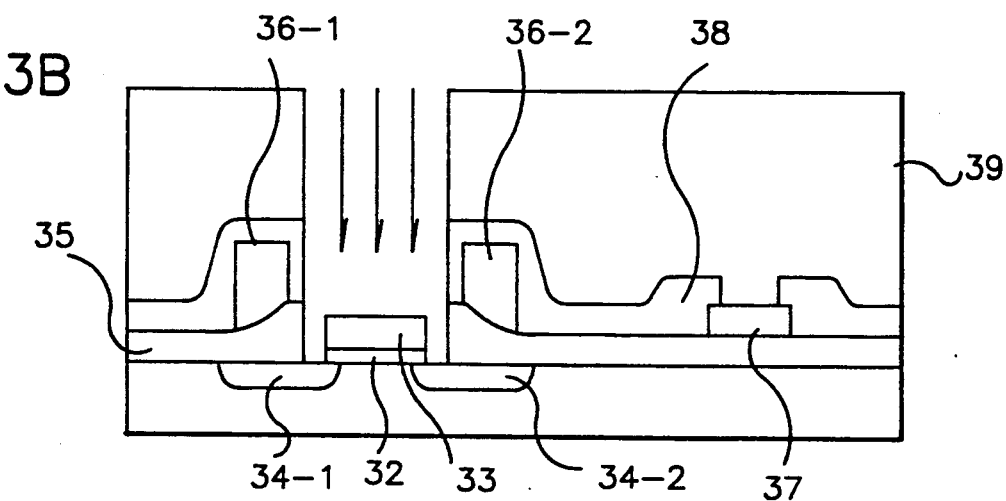

In accordance with the programming fabrication process, first, a photoresist film 39 is coated over the entire exposed surface of the structure obtained by the process of FIG. 3A, as shown in FIG. 3B. Thereafter, the photoresist film 39 is removed at its portion disposed over the gate electrode 33 and portions of source and drain regions 34-1 and 34-2 adjacent to the gate electrode 33, so as to expose a corresponding portion of the nitride film 38. Using the photoresist film 39, the exposed portion of nitride film 38 is then etched so that the BPSG 35 is partially exposed.

Thereafter, the exposed portion of BPSG 35 is removed so as to expose the gate electrode 33 and the portions of source and drain regions 34-1 and 34-2 adjacent to the gate electrode 33. In the exposed portions, ROM code ions corresponding to the user's order are implanted.

Figure 3C:
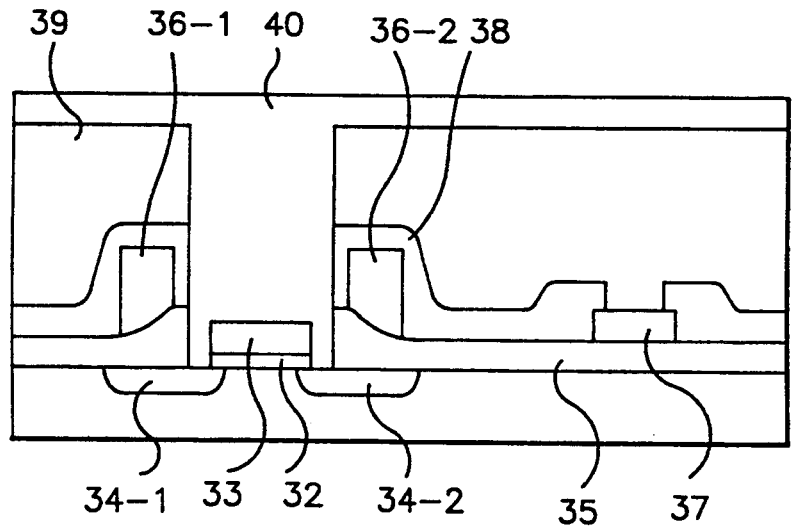

After the implantation of ROM code ions, a PIQ (Poly Imide Iso Indro Quiazolin Dione) film 40 is formed over the entire exposed surface of the resultant structure, as shown in FIG. 3C.

Figure 3D:
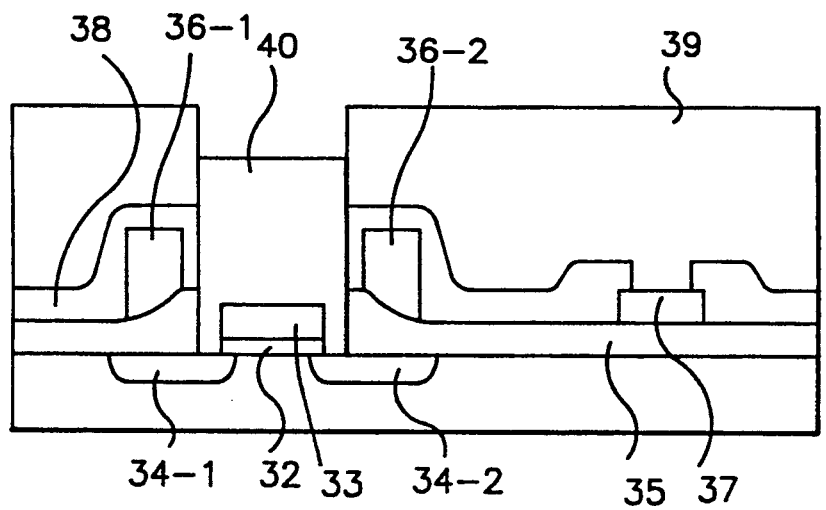

Thereafter, the PIQ film 40 is then partially photoetched so that its portion disposed over the photoresist film 39, as shown in FIG. 3D, is removed.

Figure 3E:
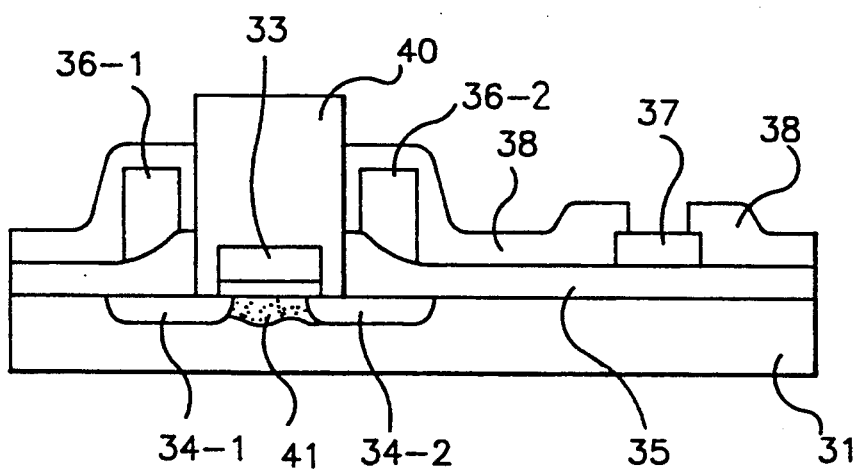

Finally, the remaining photoresist film 39 is completely removed, as shown in FIG. 3E. Subsequently the PIQ film 40 is subjected to a heat treatment at a temperature of about 450° C., to cure it. At this time, the impurity ions implanted become active, thereby forming an impurity diffusion region 41 in the channel region defined beneath the gate electrode 33.

Figure 1A:
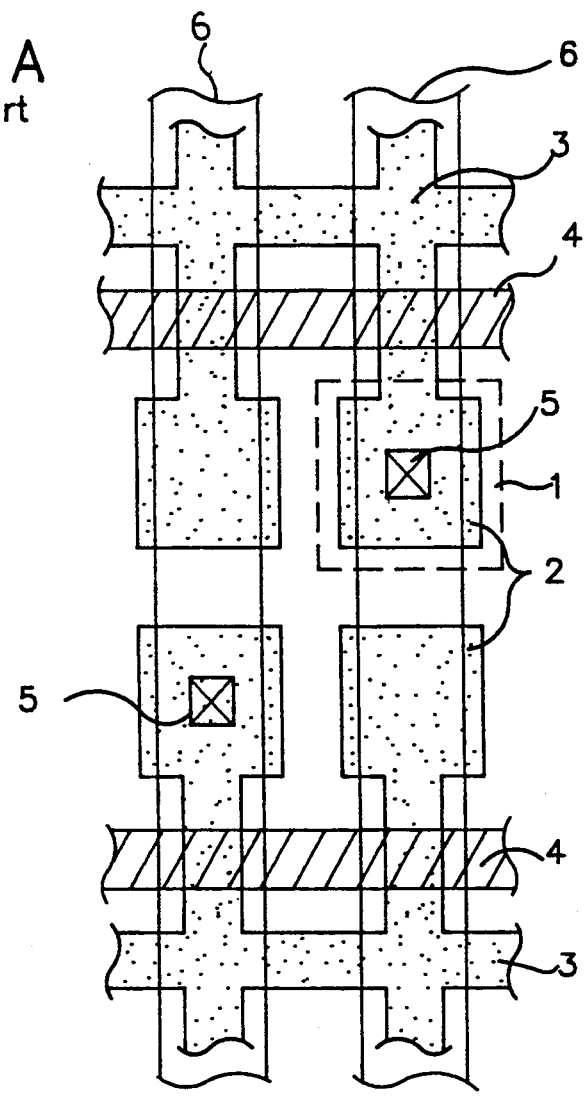
FIG. 1A is a plan view of a conventional MROM of the contact opening and closing type.
Figure 1B:
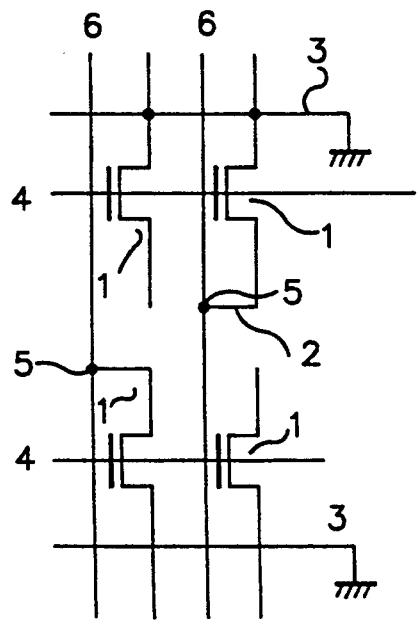
FIG. 1B is a circuit diagram of an equivalent circuit of the MROM shown in FIG. 1A.
Figure 2A:
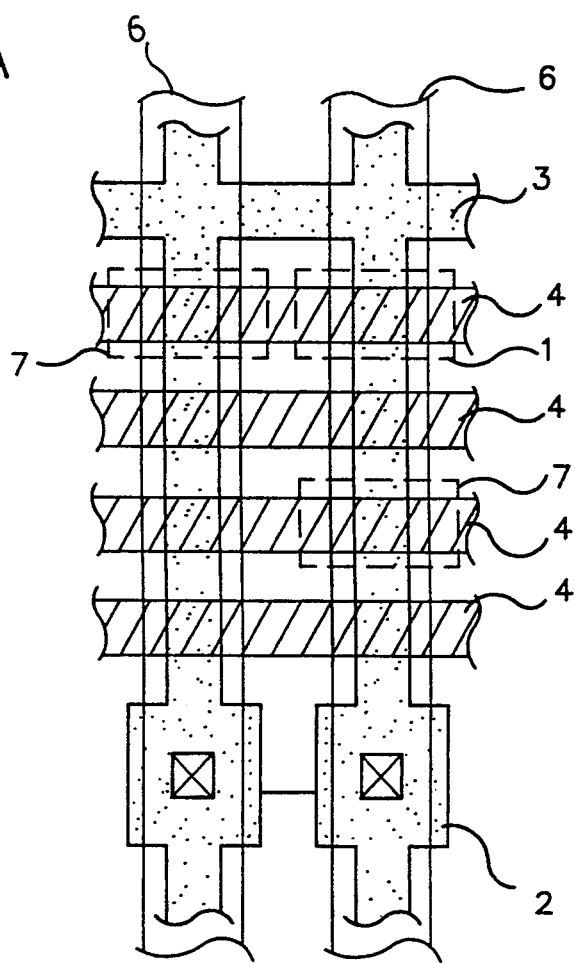
FIG. 2A is a plan view of a conventional ion-implanted MROM of the NAND type.
Figure 2B:
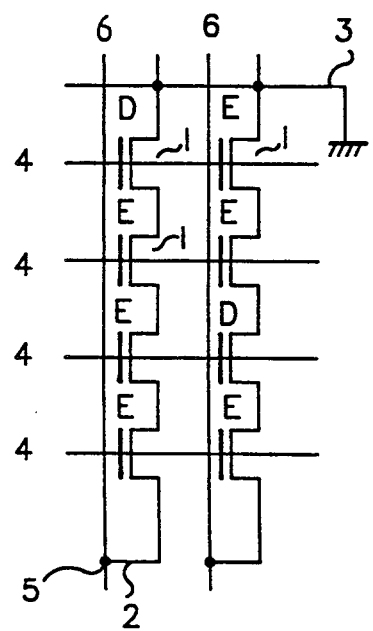
FIG. 2B is a circuit diagram of an equivalent circuit of the MROM shown in FIG. 2A.

As a result, the MOS transistor with the impurity diffusion region 41 becomes a transistor operating in the depletion mode, corresponding to information of "1" as described in conjunction with FIG. 2B.

Since writing of data is achieved by the implantation of ROM code ions, an MROM corresponding to the user's order can be obtained.

Although the present invention has been described in conjunction with the fabrication of a single memory cell shown in FIGS. 3A to 3E, it is equally applicable to a case of fabricating a memory cell array having a plurality of memory cells. In such a case, a plurality of memory cells are formed in the same manner as in FIG. 3A. In the channel region of each MOS transistor corresponding to coding with information of "1", ROM code ions according to the user's order are implanted in the same manner as in FIG. 3B, so as to form impurity diffusion regions 41 in selected MOS transistors. During the ROM code ion implantation step, no ROM code ion is implanted in the channel region of MOS transistors corresponding to coding with information of "0" so that the MOS transistors which have no impurity diffusion region 41 are still maintained in an unprogrammed condition, as in FIG. 3A.

In other words, in fabricating the memory cell array, those MOS transistors programmed with "1's" are subjected to a ROM code ion implantation at their channel regions, so that impurity diffusion regions are formed at the channel regions. As a result, the MOS transistors become transistors operating in the depletion mode. On the other hand, such impurity diffusion regions are not formed in the MOS transistors to be programmed with "0's". As a result, the latter MOS transistors become transistors operating in the enhancement mode.

Thus the MROM is programmed with data, by the ROM code ion implantation process.

In accordance with the MROM fabricating method of the present invention, it is possible to reduce the processing time (TAT) taken in fabricating MROM by the manufacturer after receipt of an order.

As mentioned above, in accordance with the conventional method the implantation of ROM code ions according to the user's order is carried out just after the fabrication of the MOS transistor achieved by forming the gate oxide film, the gate electrode and source/drain regions on the semiconductor substrate. Thereafter, the BPSG film, the metal electrode, the passivation film and the pad are sequentially formed. Since the process of implanting ROM code ions is carried out at the initial stage of the MROM fabrication process, the processing time (TAT) taken in fabricating the MROM by the manufacturer after the ordering by the user is lengthened.

In accordance with the present invention however, the fabrication of the MOS transistor is first achieved by forming the gate oxide film, the gate electrode and source/drain regions on the semiconductor substrate. Thereafter, the BPSG film, the metal electrode, the passivation film and the pad are sequentially formed. Finally, the implantation of ROM code ions according to the user's order is carried out, to program the MROM. Thus it is possible to reduce the processing time (TAT) taken in fabricating and programming the MROM by the manufacturer after order by the user because the ROM code ion implantation is carried out at the final stage of the MROM fabrication. This improves productivity.

Although the preferred embodiments of the invention have been disclosed for illustrative purposes, those skilled in the art will appreciate that various modifications, additions and substitutions are possible without departing from the scope and spirit of the invention as disclosed in the accompanying claims.

What is claimed is:

1. A method for fabricating a mask read only memory, comprising the steps of:
    forming a gate oxide film, a gate electrode and source and drain regions on one portion of a semiconductor substrate to form a MOS transistor;
    depositing a BPSG film over the entire exposed surface of the resultant structure after the formation of the MOS transistor to smooth the structure;
    forming a metal electrode on portions of the BPSG film, which portions are disposed over the source and drain regions;
    forming a pad on a portion of the BPSG film, which portion is disposed over another portion of the semiconductor substrate, the pad being adapted to provide a connection with an outer circuit;
    coating a nitride film over the entire exposed surface of the resultant structure after the formation of the pad and removing a portion of the nitride film disposed over the pad to expose the pad;
    coating a photoresist film over the entire exposed surface of the resultant structure after the partial removal of the nitride film and removing portions of the photoresist film, which portions are disposed over the gate electrode and portions of the source and drain regions of the MOS transistor to be implanted with ROM code ions, to partially expose the nitride film and the source and drain region portions disposed adjacent to the gate electrode;

removing the exposed portion of the nitride film, to partially expose the BPSG film;

selectively removing the exposed portion of the BPSG film to expose the gate electrode and the source and drain region portions disposed adjacent to the gate electrode;

implanting ROM code ions in the exposed gate electrode and source and drain region portions;

forming a PIQ (Poly Imide Iso Indro Quizolin Dione) film over the entire exposed surface of the resultant structure after the ion implantation and removing a portion of the PIQ (Poly Imide Iso Indro Quizolin Dione) film disposed over the remaining photoresist film;

removing the remaining photoresist film; and curing the remaining PIQ (Poly Imide Iso Indro Quizolin Dione) film by a heat treatment and simultaneously forming an impurity diffusion region in a portion of the semiconductor substrate disposed beneath the gate electrode.

2. In a method for fabricating and programming a mask read only memory comprised of an array of a plurality of MOS transistors, certain designated transistors of said array operating in a depletion mode to indicate operation in one logic state and other designated transistors operating in the enhancement mode, a method for fabricating substantially the entire structure of the memory prior to performing the fabrication step for designation of those transistors selected for operation in the enhancement mode, said method comprising the steps of:

forming a gate oxide film, a gate electrode and source and drain regions on one portion of a semiconductor substrate to form a MOS transistor;

depositing a BPSG film over the entire exposed surface of the resultant structure after the formation of the MOS transistor to smooth the structure;

forming a metal electrode on portions of the BPSG film, which portions are disposed over the source and drain regions;

forming a pad on a portion of the BPSG film, which portion is disposed over another portion of the semiconductor substrate, the pad being adapted to provide a connection with an outer circuit;

coating a nitride film over the entire exposed surface of the resultant structure after the formation of the pad and removing a portion of the nitride film disposed over the pad to expose the pad;

coating a photoresist film over the entire exposed surface of the resultant structure after the partial removal of the nitride film and removing portions of the photoresist film, which portions are disposed over the gate electrode and portions of the source and drain regions of the MOS transistor to be implanted with ROM code ions, to partially expose the nitride film and the source and drain region portions disposed adjacent to the gate electrode;

removing the exposed portion of the nitride film, to partially expose the BPSG film;

selectively removing the exposed portion of the BPSG film to expose the gate electrode and the source and drain region portions disposed adjacent to the gate electrode;

implanting ROM code ions in the exposed gate electrode and source and drain region portions;

forming a PIQ (Poly Imide Iso Indro Quizolin Dione) film over the entire exposed surface of the resultant structure after the ion implantation and removing a portion of the PIQ (Poly Imide Iso Indro Quizolin Dione) film disposed over the remaining photoresist film;

removing the remaining photoresist film; and curing the remaining PIQ (Poly Imide Iso Indro Quizolin Dione) film by a heat treatment and simultaneously forming an impurity diffusion region in a portion of the semiconductor substrate disposed beneath gate electrodes of MOS transistors selected to operate in the enhancement mode thereby causing the MOS transistor controlled by the gate electrodes wherein the impurity diffusion region is formed to operate in the enhancement mode.

* * * * *

UNITED STATES PATENT AND TRADEMARK OFFICE
CERTIFICATE OF CORRECTION

PATENT NO. : 5,350,703
DATED : September 27, 1994
INVENTOR(S) : Byoung Il LEE

It is certified that error appears in the above-indentified patent and that said Letters Patent is hereby corrected as shown below:

On the title page, and column 1, line 1, the title should read

—METHOD FOR FABRICATING MASK ROM— at column 5, line 25, "Quiazolin" should be corrected to read --Quinazolin--.

at column 7, lines 14 and 17 and at column 8, lines 29 and 37, "Quizolin" should be corrected to read --Quinazolin--.

Signed and Sealed this

Twenty-seventh Day of December, 1994

*Attest:*

BRUCE LEHMAN

*Attesting Officer*  *Commissioner of Patents and Trademarks*